(12) United States Patent
Moran et al.

(10) Patent No.: US 7,012,457 B2
(45) Date of Patent: Mar. 14, 2006

(54) MIXER CIRCUIT OFFSET COMPENSATION

(75) Inventors: Andrew Moran, Wiltshire (GB);
Stephen John Parry, Wiltshire (GB);
Alun Vaughan Watkins, Faringdon (GB)

(73) Assignee: Zarlink Semiconductor Limited, Wiltshire (GB)

( * ) Notice: Subject to any disclaimer, the term of this patent is extended or adjusted under 35 U.S.C. 154(b) by 0 days.

(21) Appl. No.: 10/825,601

(22) Filed: Apr. 16, 2004

(65) Prior Publication Data
US 2005/0001669 A1    Jan. 6, 2005

(30) Foreign Application Priority Data
Apr. 22, 2003    (GB) .................................... 0309043

(51) Int. Cl.
*G06F 7/44*    (2006.01)
(52) U.S. Cl. ...................................... 327/359; 327/362
(58) Field of Classification Search ........ 327/355–357, 327/359–362; 330/252, 261; 455/326, 333, 455/209, 189.1
See application file for complete search history.

(56) References Cited

U.S. PATENT DOCUMENTS

| 6,438,365 | B1 * | 8/2002 | Balteanu ...................... 455/326 |
| 6,535,725 | B1 * | 3/2003 | Hatcher et al. ............. 455/317 |
| 6,559,706 | B1 * | 5/2003 | Johnson ...................... 327/359 |

FOREIGN PATENT DOCUMENTS

| GB | 2 321 147 A | 7/1998 |
| GB | 2 323 228 A | 9/1998 |

* cited by examiner

Primary Examiner—My-Trang Nuton
(74) Attorney, Agent, or Firm—Arent Fox PLLC

(57) ABSTRACT

A mixer circuit arrangement for frequency-translating a voltage input signal by an amount dependent on the frequency of a local oscillator signal to provide an output signal. The arrangement comprises an input stage 33 and a mixer stage 32, the input stage 33 being arranged to convert the voltage input signal into differential current signals and the mixer stage 32 being arranged to mix the differential current signals with the local oscillator signal to provide the output signal. Means 34,35 is provided for injecting a compensation current into the input stage 33 so as to balance the differential current signals provided to the mixer stage 32.

7 Claims, 5 Drawing Sheets

MIXER CIRCUIT OFFSET COMPENSATION

FIELD OF THE INVENTION

The present invention relates to mixer circuit offset compensation and in particular, though not necessarily, to compensation for D.C. offsets in mixer circuits which give rise to local oscillator breakthrough.

BACKGROUND OF THE INVENTION

Mixer circuits are commonly used to perform a frequency translation of a modulated input signal such that the output signal contains all the same phase and amplitude modulation present on the input signal translated onto a different output carrier frequency. The output carrier frequency can be either higher or lower than the frequency of the input carrier. These frequency translations are known respectively as upconversion and downconversion. Frequency translation of an input signal in this way necessarily results in degradation of the quality of the signal. Degradation is caused particularly by the addition of thermal noise, signal distortion through the use of non-linear components, the addition of signals harmonically related to both the frequency of the local oscillator used in the frequency translation and the input carrier frequency, leakage of the input signal to the output, and leakage of the local oscillator signal into both the input and the output. This latter effect is known as local oscillator "breakthrough".

FIG. 1 shows a known balanced mixer circuit arrangement, known as a Gilbert cell mixer. The arrangement comprises generally an input stage 10, a mixer core 11, and a current source 12. The input stage comprises first and second npn transistors 13 and 14, each of which has its emitter electrodes connected to an output of the current source 12 by respective ones of emitter degeneration or series feedback resistors 15 and 16. The base electrodes of the first and second transistors 13,14 serve as the differential voltage inputs 13a,14a to the mixer circuit arrangement. The current source 12 includes a transistor 18, an emitter grounding resistor 19 and a capacitor 20, which is connected between the base electrode of the transistor 18 and ground potential. The base electrode of the transistor 18 is biased by a voltage source (not shown). The collector electrode of the transistor 18 forms the output of the current source 12. The current source 12 is a high impedance current source, which sets the quiescent current for the whole of the mixer circuit arrangement.

The mixer core 11 includes first to fourth npn transistors 21 to 24, the collector electrodes of which are cross-connected and connected to a supply line ($V_{cc}$) 25 by respective ones of load resistors 26 and 27. First and second output terminals 28 and 29 are connected to the lower terminals of the load resistors 26 and 27. Local oscillator input terminals 30 and 31 are connected to the base electrodes of the mixer core transistors 21 to 24.

Assuming that the Gilbert cell mixer is perfectly balanced, and in particular that the collector currents of the input stage transistors 13,14 are balanced, the output from the mixer core will consist mainly of the desired primary sidebands. However, any imbalance will tend to give rise to D.C. offsets in the circuit, one consequence of which will be local oscillator breakthrough into the output waveform of the mixer. Integrated Circuit (IC) layout techniques are optimised to achieve the best possible match, but this is limited by inherent mismatches found in IC devices, especially CMOS devices.

SUMMARY OF THE INVENTION

It is an object of the present invention to provide compensation for imbalance in a mixer circuit and thereby to reduce the effect of local oscillator breakthrough in the output.

According to a first aspect of the present invention there is provided a mixer circuit arrangement for frequency-translating a voltage input signal by an amount dependent on the frequency of a local oscillator signal to provide an output signal, comprising an input stage and a mixer stage, the input stage being arranged to convert the voltage input signal into differential current signals and the mixer stage being arranged to mix the differential current signals with the local oscillator signal to provide the output signal, characterised by means for injecting a compensation current into the input stage so as to balance the differential current signals provided to the mixer stage.

The means for injecting a compensation current into the input stage may comprise means for injecting the compensation current into a voltage input of the input stage, the voltage input being one of a pair of differential inputs for receiving said voltage input signal.

The means for injecting a compensation current into the input stage may comprise a memory for storing a predetermined compensation current value, and means for generating a compensation current corresponding to that value. For example, the value may be stored as a digital value, the means comprising a digital to analogue converter for converting the digital value into a corresponding analogue current. The means comprises a digitally controlled switch for selecting the voltage input of the input stage to which the compensation current is to be applied.

The means for injecting a compensation current into the input stage may comprise a resistor bridge coupling input voltages to the voltage inputs of the input stage, the compensation current being injected into the input stage via the resistor bridge.

Preferably, the mixer circuit arrangement including the means for injecting a compensation current into the input stage is integrated into a single chip.

According to a second aspect of the present invention there is provided a method of reducing local oscillator breakthrough in a mixer circuit arrangement for frequency-translating a voltage input signal by an amount dependent on the frequency of a local oscillator signal to provide an output signal, the mixer circuit comprising an input stage and a mixer stage, the input stage being arranged to convert the voltage input signal into differential current signals and the mixer stage being arranged to mix the differential current signals with the local oscillator signal to provide the output signal, the method comprising injecting a compensation current into the input stage so as to balance the differential current signals provided to the mixer stage.

DETAILED DESCRIPTION OF CERTAIN EMBODIMENTS

Figure 1:
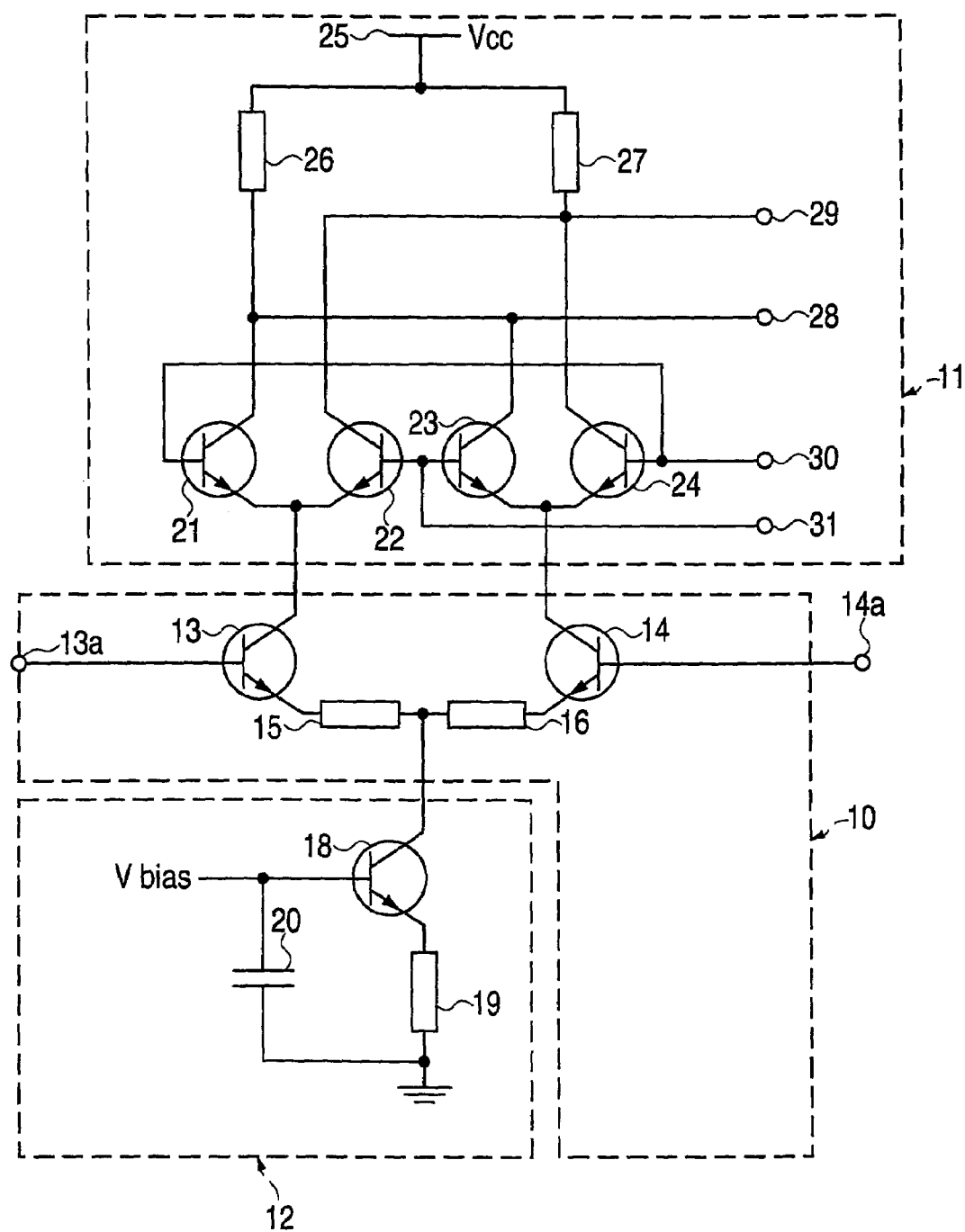
FIG. 1 shows a prior art mixer circuit arrangement.
Figure 2:
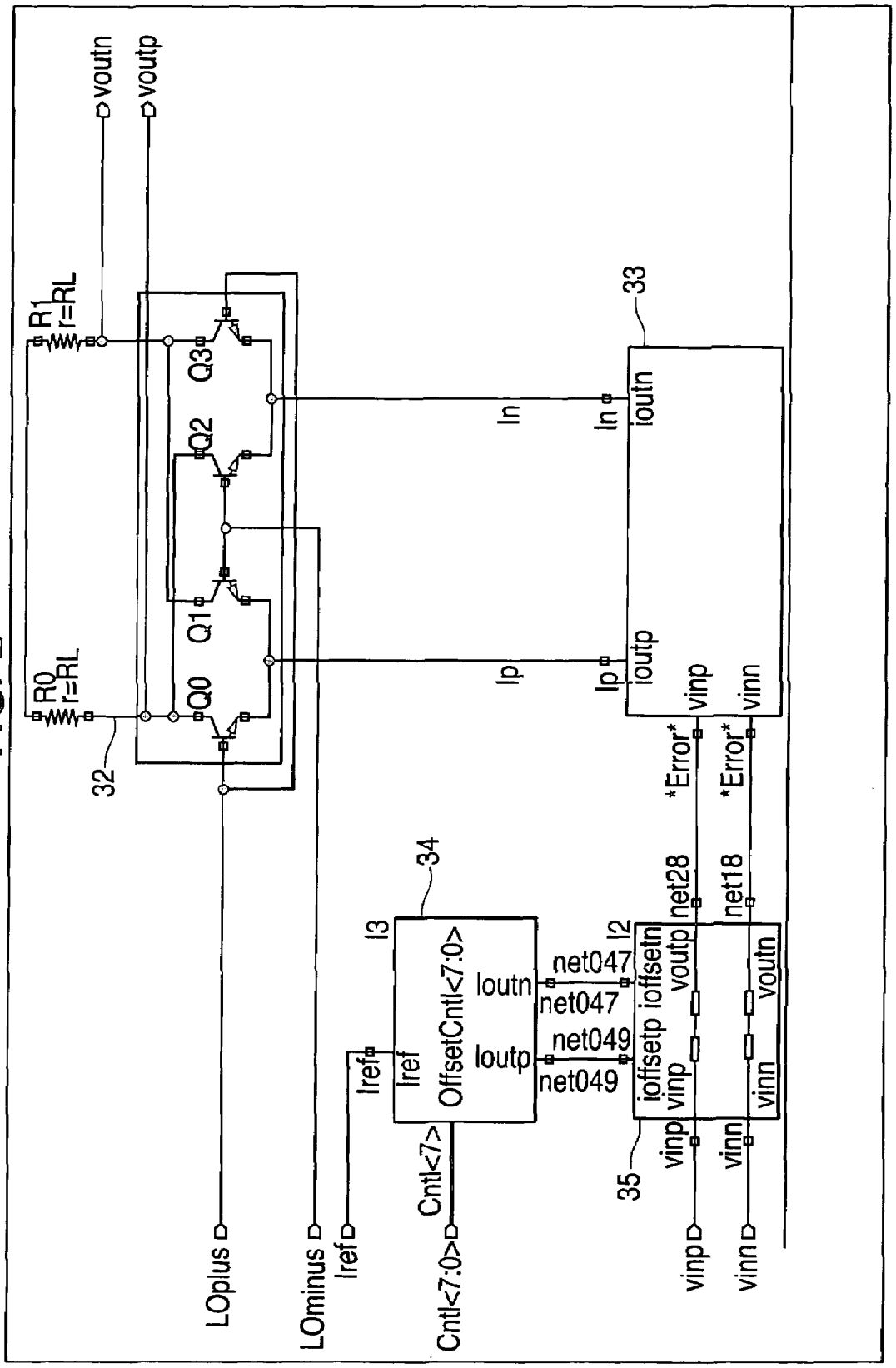
FIG. 2 illustrates schematically a mixer circuit arrangement embodying the present invention.

A prior art mixer circuit arrangement has already been described with reference to FIG. 1. FIG. 2 illustrates a modified balanced mixer arrangement in which a mixer core 32 corresponds to the mixer stage 11 of the arrangement of FIG. 1. A voltage-current converter 33 corresponds to a combination of the input stage 10 and the current source 12 of the prior art arrangement. Circuit details are omitted from the circuit of FIG. 2 for simplicity. It will be appreciated that this arrangement is given by way of example. Other features such as an interstage filter may be added to the arrangement.

FIG. 2 shows a compensation current block 34 which is arranged to provide a compensation current to one of two outputs, $I_{outp}$ and $I_{outn}$. These outputs are coupled to a resistor network 35, which has a pair of inputs coupled to the input voltage signal $V_{inp}$ and $V_{inn}$ and a pair of outputs coupled to voltage inputs of the voltage-current converter 33.

Figure 3:
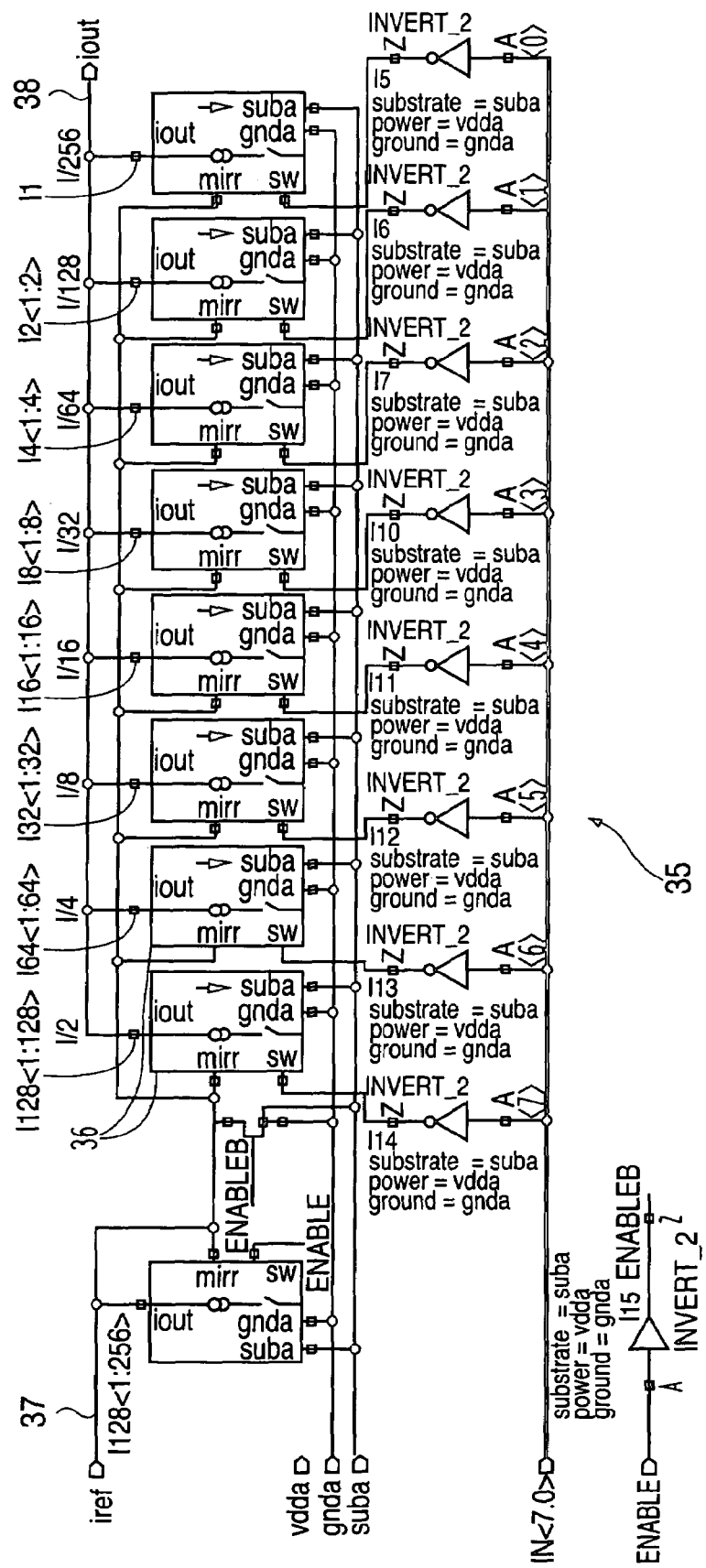
FIG. 3 shows a circuit detail of the mixer circuit arrangement of FIG. 2 for generating a compensation current.

The compensation current block 34 comprises three main functional circuit components. A first of these components 35 is shown in FIG. 3, and comprises a series of eight current mirrors 36 which are switched in and out in dependence upon the least 8 significant bits of a digital control word. (This control word is 9 bits in length—8 bits for controlling the current mirrors and 1 bit for setting the polarity.) The component 35 receives at an input 37 a constant current reference signal $I_{ref}$, and provides at an output 38 an output current $I_{out}$ which is a fractional value of the reference current. The digital control word is stored in a memory, not shown in the Figures.

Figure 4B:
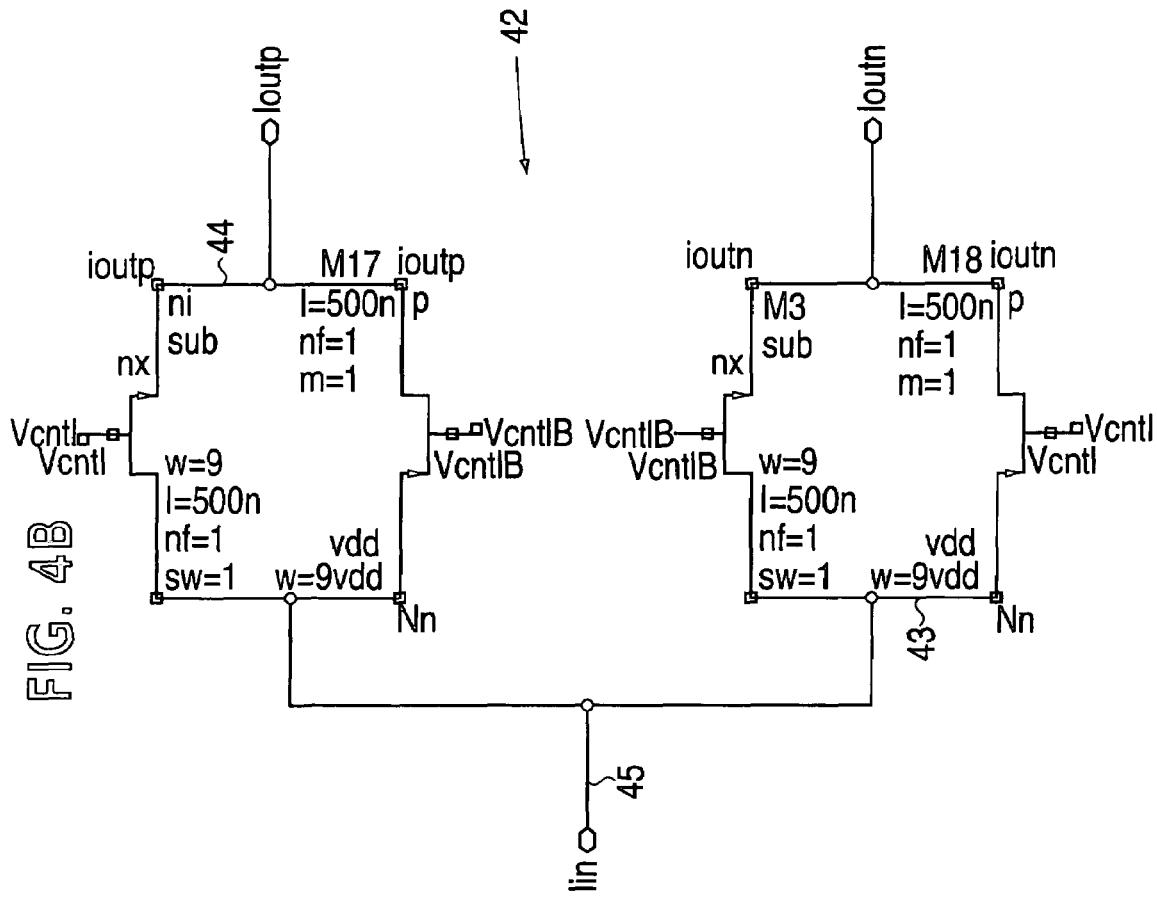
FIG. 4B shows a circuit detail of the mixer circuit arrangement of FIG. 2 for switching a compensation current between inputs of an input stage of the arrangement.
Figure 4A:
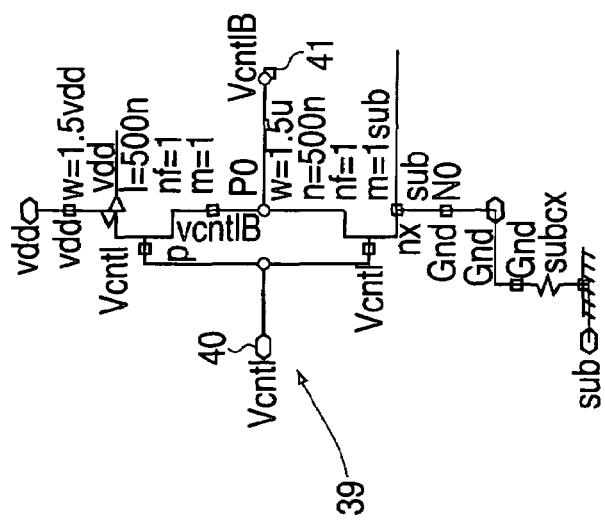
FIG. 4A shows a circuit detail of the mixer circuit arrangement of FIG. 2 for generating switching signals from a control input.

FIG. 4A shows a second functional circuit component 39 of the compensation current block 34. This receives at an input ($V_{cntl}$) 40 the most significant bit of the digital control word, and generates the complement of this bit at an output 41 ($V_{cntlB}$). The third functional component 42 is illustrated in FIG. 4B, and comprises a pair of current switches 43, 44 which are switched on and off respectively by the control signals $V_{cntl}$ and $V_{cntlB}$. The output current $I_{out}$ provided by the circuit of FIG. 3 is applied to a common current input 45 of the pair of switches. Depending upon the value of the most significant bit of the digital control word, the current $I_{out}$ appears one or other of the outputs of the current switches, i.e. the second and third functional components together provide current steering towards either the positive or negative inputs of the resistor network 35.

Figure 5:
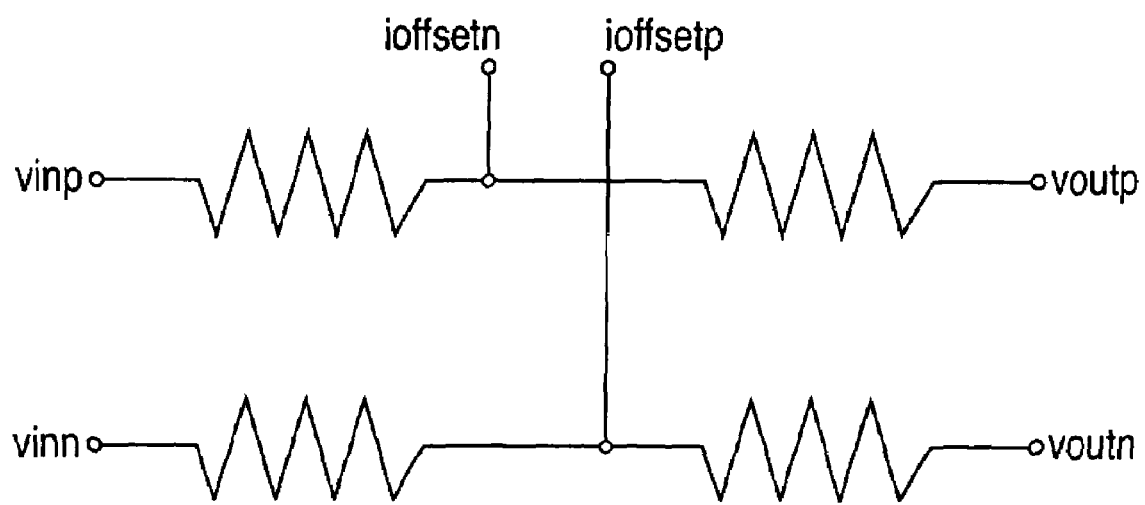
FIG. 5 shows a resistor network of the the circuit arrangement of FIG. 2.

FIG. 5 illustrates in more detail the resistor network 35 of the circuit arrangement of FIG. 2.

The operation of the embodiment described with reference to FIGS. 2 to 5 will now be explained. Following fabrication of the described mixer circuit, and with the digital control word programmed to be zero, the differential output voltage of the mixer stage is analysed for a range of input signals and for one or more local oscillator frequencies. Using an appropriate algorithm, the value of the digital control word which would minimise the local oscillator breakthrough could be determined. This control word aims to provide an offset current into the input stage which is equal to but of opposite polarity to the D.C. offset which is giving rise to the local oscillator breakthrough. The memory is programmed with this word, and tests run to determine whether or not this value produces optimum results. If not, the value may be tweaked, i.e. adjusted up or down.

Rather than using some algorithm to determine a suitable value for the digital control word, the digital control word may be determined empirically. A typical value may be programmed to the memory, and the results analysed. Depending upon the direction and magnitude of the change in local oscillator breakthrough, the value is adjusted up or down. This process is repeated until the optimum value is determined.

It will be appreciated that the resolution of the offset compensation mechanism is dependent upon the size of the digital control word and the number of current mirrors in the circuit of FIG. 3.

Although a Gilbert cell mixer arrangement has been described hereinbefore, other arrangements, for example using any other type of transconductor, could be used. Such transconductors include micro mixer circuits, single balanced mixers and the like, including transconductors having differential inputs, as long as a differential current signal is provided as an output signal.

It will be appreciated by the person of skill in the art that various modifications may be made to the above described embodiments without departing from the scope of the present invention.

What is claimed is:

1. A mixer circuit arrangement for frequency-translating a voltage input signal by an amount dependent on the frequency of a local oscillator signal to provide an output signal, comprising an input stage and a mixer stage, the input stage being arranged to convert the voltage input signal into differential current signals and the mixer stage being arranged to mix the differential current signals with the local oscillator signal to provide the output signal, characterised by means for injecting a compensation current into the input stage so as to balance the differential current signals provided to the mixer stage.

2. A circuit according to claim 1, the means for injecting a compensation current into the input stage comprising means for injecting the compensation current into a voltage input of the input stage, the voltage input being one of a pair of differential inputs for receiving said voltage input signal.

3. A circuit according to claim 1, the means for injecting a compensation current into the input stage comprising a memory for storing a predetermined compensation current value, and means for generating a compensation current corresponding to that value.

4. A circuit according to claim 3, the value being stored as a digital value, and the means comprising a digital to analogue converter for converting the digital value into a corresponding analogue current.

5. A circuit according to claim 4, said means comprising a digitally controlled switch for selecting the voltage input of the input stage to which the compensation current is to be applied.

6. A circuit according to claim 1, the means for injecting a compensation current into the input stage comprising a resistor bridge coupling input voltages to the voltage inputs of the input stage, the compensation current being injected into the input stage via the resistor bridge.

7. A method of reducing local oscillator breakthrough in a mixer circuit arrangement for frequency-translating a voltage input signal by an amount dependent on the frequency of a local oscillator signal to provide an output signal, the mixer circuit comprising an input stage and a mixer stage, the input stage being arranged to convert the voltage input signal into differential current signals and the mixer stage being arranged to mix the differential current signals with the local oscillator signal to provide the output signal, the method comprising injecting a compensation current into the input stage so as to balance the differential current signals provided to the mixer stage.

* * * * *